(12) United States Patent
Ryoichi et al.

(10) Patent No.: US 8,680,404 B2
(45) Date of Patent: Mar. 25, 2014

(54) PRINTED CIRCUIT BOARD INCLUDING VIA PAD WITH CONCAVO-CONVEX PATTERNS AND METHOD OF MANUFACTURING THE SAME

(75) Inventors: Watanabe Ryoichi, Suwon-si (KR); Se Won Park, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 456 days.

(21) Appl. No.: 12/656,643

(22) Filed: Feb. 5, 2010

(65) Prior Publication Data

US 2011/0100686 A1    May 5, 2011

(30) Foreign Application Priority Data

Oct. 30, 2009  (KR) .................. 10-2009-0104212

(51) Int. Cl.
*H05K 1/11*    (2006.01)
(52) U.S. Cl.
USPC ............ 174/262; 174/263; 174/261; 174/266
(58) Field of Classification Search
USPC ................ 174/257; 29/839, 841; 205/291;
428/199–200
See application file for complete search history.

(56) References Cited

U.S. PATENT DOCUMENTS

| | | | | |
|---|---|---|---|---|
| 6,242,813 B1* | 6/2001 | Huang et al. | .................. | 257/784 |
| 6,590,165 B1* | 7/2003 | Takada et al. | .................. | 174/266 |
| 7,170,181 B2* | 1/2007 | Coolbaugh et al. | ........... | 257/775 |
| 2001/0051426 A1* | 12/2001 | Pozder et al. | .................. | 438/666 |
| 2005/0121803 A1* | 6/2005 | Angell et al. | .................. | 257/779 |
| 2006/0207790 A1* | 9/2006 | Choi | .............................. | 174/262 |
| 2008/0149379 A1* | 6/2008 | Nagase et al. | ................. | 174/260 |
| 2008/0179755 A1* | 7/2008 | Andry et al. | .................. | 257/774 |
| 2009/0268146 A1* | 10/2009 | Kook et al. | .................... | 349/149 |

FOREIGN PATENT DOCUMENTS

| | | |
|---|---|---|
| JP | 10-32280 | 2/1998 |
| JP | 2001-203448 | 7/2001 |
| JP | 2006-269466 | 10/2006 |
| JP | 2007-27476 | 2/2007 |
| JP | 2007-234659 | 9/2007 |
| KR | 2000-0052630 | 8/2000 |
| KR | 10-2009-0023126 | 3/2009 |

OTHER PUBLICATIONS

Japanese Office Action issued Feb. 21, 2012 in corresponding Japanese Patent Application No. 2010-023587.
Korean Office Action issued Jul. 1, 2011 in corresponding Korean Patent Application No. 10-2009-0104212.
Japanese Office Action for Application No. 2010-023587 issued Jun. 12, 2012.

* cited by examiner

*Primary Examiner* — Tuan T Dinh
*Assistant Examiner* — Steven Sawyer (57) ABSTRACT

The present invention provides a printed circuit board including: a circuit pattern formed on a first insulating layer; a via pad disposed on the first insulating layer by being spaced apart from the circuit pattern, formed on a lower surface, where a via hole is formed, to have a cross section larger than that of the via hole, and having concavo-convex patterns; a second insulating layer formed on the via pad where the via hole is not formed and on the circuit pattern; and a copper foil layer formed on the second insulating layer and the via hole, and a method of manufacturing the same.

4 Claims, 8 Drawing Sheets

PRINTED CIRCUIT BOARD INCLUDING VIA PAD WITH CONCAVO-CONVEX PATTERNS AND METHOD OF MANUFACTURING THE SAME

CROSS-REFERENCE TO RELATED APPLICATIONS

This application claims the benefit of Korean Patent Application No. 10-2009-0104212 filed with the Korea Intellectual Property Office on Oct. 30, 2009, the disclosure of which is incorporated herein by reference.

BACKGROUND OF THE INVENTION

1. Field of the Invention

The present invention relates to a printed circuit board including a via pad with concavo-convex patterns of various shapes and a method of manufacturing the same.

2. Description of the Related Art

A printed circuit board (PCB) is a circuit board which plays a role of electrically connecting or mechanically fixing predetermined electronic components and consists of an insulating layer made of a phenol resin or an epoxy resin and a copper foil layer attached to the insulating layer and having a predetermined wiring pattern formed thereon.

At this time, the PCBs are classified into a single-sided PCB in which wiring is formed on one surface of an insulating layer, a double-sided PCB in which wirings are formed on both surfaces of an insulating layer, and a multilayer PCB in which wirings are formed in a plurality of layers, according to the number of stacked layers.

Recently, high density of a build-up substrate is required due to miniaturization, thickness reduction, and high density of electronic products, and a high reliability substrate is required at the same time.

Like this, in order to secure high reliability of the substrate, an insulating material having a low coefficient of thermal expansion (CTE) and a high glass transition temperature has been developed, and in order to improve via connection reliability, a laser via, a desmear solution, and a process have been actively developed.

In general, a via hole is formed on the PCB by laser drilling.

The via hole is formed on a circular or square via pad, which is formed on an insulator, by laser drilling. An upper portion and a lower portion of the via hole are plated by electroless plating or electroplating to be electrically connected to each other.

The shape of the general via pad is larger than a diameter of a bottom of the via hole, and the via pad is formed by copper plating. However, there is a problem of a plating thickness difference due to an area difference between a region where the circuit pattern is formed and a region where the via pad is formed.

SUMMARY OF THE INVENTION

The present invention has been proposed in order to solve the above-described problems, and it is, therefore, an object of the present invention to provide a printed circuit board including a via pad with concavo-convex patterns capable of securing reliability of via connection and improving uniformity of via pad thickness, and a method of manufacturing the same.

In accordance with an aspect of the present invention to achieve the object, there is provided a printed circuit board including: a circuit pattern formed on a first insulating layer; a via pad disposed on the first insulating layer by being spaced apart from the circuit pattern, formed on a lower surface, where a via hole is formed, to have a cross section larger than that of the via hole, and having concavo-convex patterns; a second insulating layer formed on the via pad where the via hole is not formed and on the circuit pattern; and a copper foil layer formed on the second insulating layer and the via hole.

In accordance with another aspect of the present invention to achieve the object, there is provided a printed circuit board including: a circuit pattern formed by etching a portion of a first insulating layer; a via pad formed by etching a portion of the first insulating layer, disposed by being spaced apart from the circuit pattern, formed on a lower surface, where a via hole is formed, to have a cross section larger than that of the via hole, and having concavo-convex patterns; a second insulating layer formed on the via pad where the via hole is not formed and on the circuit pattern; and a copper foil layer formed on the second insulating layer and the via hole.

Further, the concavo-convex patterns of the printed circuit board in accordance with the present invention may be formed in at least one of a circular shape, a hexagonal shape, a square shape, a spiral shape, and a shape formed by crossing a plurality of diagonal lines.

Further, the first insulating layer of the printed circuit board in accordance with the present invention may be made of polyimide.

Further, the circuit pattern or the via pad of the printed circuit board in accordance with the present invention may be formed of a copper foil layer.

Further, the concavo-convex patterns of the printed circuit board in accordance with the present invention may be formed by laser irradiation.

Further, the concavo-convex patterns of the printed circuit board in accordance with the present invention may be formed by etching some or all of the thickness of the via pad.

Further, the concavo-convex patterns of the printed circuit board in accordance with the present invention may be formed by etching the via pad and portions of the first insulating layer on a lower surface of the via pad.

In accordance with still another aspect of the present invention to achieve the object, there is provided a method of manufacturing a printed circuit board including the steps of: forming a circuit pattern and a via pad, which is disposed by being spaced apart from the circuit pattern and has concavo-convex patterns, on a first insulating layer; forming a second insulating layer on the circuit pattern and the via pad having the concavo-convex patterns formed thereon; forming a via hole by etching a portion of the second insulating layer on the via pad; and forming a copper foil layer on the second insulating layer having the via hole formed therein.

In accordance with still another aspect of the present invention to achieve the object, there is provided a method of manufacturing a printed circuit board including the steps of: forming a circuit pattern by etching a portion of a first insulating layer and forming a via pad with concavo-convex patterns by etching a portion of the first insulating layer spaced apart from the circuit pattern; forming a second insulating layer on the circuit pattern and the via pad having the concavo-convex patterns formed thereon; forming a via hole by etching a portion of the second insulating layer on the via pad; and forming a copper foil layer on the second insulating layer having the via hole formed therein.

Further, in the step of forming the via pad with the concavo-convex patterns of the method of manufacturing the printed circuit board in accordance with the present invention, the concavo-convex patterns may be formed by etching portions of the via pad through laser irradiation.

Further, in the step of forming the via pad with the concavo-convex patterns of the method of manufacturing the printed circuit board in accordance with the present invention, the concavo-convex patterns may be formed in at least one of a circular shape, a hexagonal shape, a square shape, a spiral shape, and a shape formed by crossing a plurality of diagonal lines.

Further, in the step of forming the via pad with the concavo-convex patterns of the method of manufacturing the printed circuit board in accordance with the present invention, the concavo-convex patterns may be formed by etching some or all of the thickness of the via pad.

Further, in the step of forming the via pad with the concavo-convex patterns of the method of manufacturing the printed circuit board in accordance with the present invention, the concavo-convex patterns may be formed by etching the via pad and portions of the first insulating layer formed on a lower surface of the via pad.

Further, in the step of forming the via pad with the concavo-convex patterns of the method of manufacturing the printed circuit board in accordance with the present invention, the concavo-convex patterns may be regularly formed.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

A printed circuit board including a via pad with concavo-convex patterns and a method of manufacturing the same in accordance with certain embodiments of the present invention will be described below in detail with reference to the accompanying drawings. Those components that are the same or are in correspondence are rendered the same reference numeral regardless of the figure number, and redundant explanations are omitted.

Printed Circuit Board Including Via Pad with Concavo-Convex Patterns

First Embodiment

Figure 1:
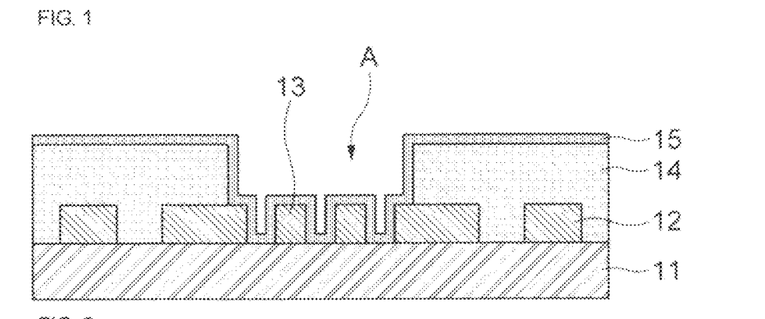
FIG. 1 is a view showing a cross section of a printed circuit board in accordance with a first embodiment of the present invention.

FIG. 1 is a view showing a cross section of a printed circuit board in accordance with a first embodiment of the present invention.

As shown in FIG. 1, a printed circuit board including a via pad with concavo-convex patterns in accordance with a first embodiment of the present invention includes a first insulating layer 11, a circuit pattern 12, a via pad 13 having concavo-convex patterns 13a and 13b formed thereon, a second insulating layer 14, and a copper foil layer 15.

The first insulating layer 11 is made of polyimide, and the circuit pattern 12 is formed on one or both surfaces of the first insulating layer 11.

The via pad 13 is disposed on the first insulating layer 11 by being spaced apart from the circuit pattern 12 and formed on a lower surface where a via hole A is formed. A cross section of the via pad 13 is larger than a lower cross section of the via hole A formed on an upper surface thereof, and the concavo-convex patterns 13a and 13b are formed on the via pad 13.

FIGS. 6a to 6f are views showing the shape of concavo-convex patterns formed on a via pad in accordance with an embodiment of the present invention.

As shown in FIGS. 6a to 6f, the concave-convex patterns 13a and 13b formed on the via pad 13 are formed in at least one of a circular shape, a hexagonal shape, a square shape, a spiral shape, and a shape formed by crossing a plurality of diagonal lines.

The concavo-convex patterns 13a and 13b are formed on the via pad 13 by forming a circular or square copper plating layer (FIG. 6a) and irradiating laser after forming windows in portions of the copper plating layer or performing plating on portions where a mask is not formed after forming the mask.

The above method of forming the concavo-convex patterns 13a and 13b is just one embodiment, and the concavo-convex patterns 13a and 13b may be formed by various methods.

Further, the concavo-convex patterns 13a and 13b may be formed by etching some or all of the thickness of the via pad 13 or by etching the via pad 13 and portions of the first insulating layer formed on a lower surface of the via pad 13.

FIGS. 3a, 3b, 4a, 4b, 5a, and 5b are views showing the shape of concavo-convex patterns in accordance with embodiments of the present invention.

Figure 3A:
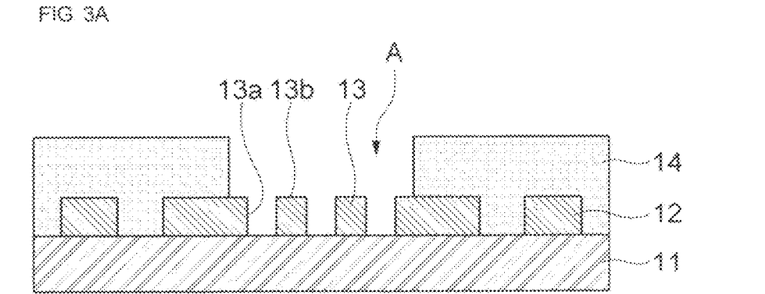
FIGS. 3a and 3b are views showing the shape of concavo-convex patterns in accordance with a first embodiment of the present invention.
Figure 3B:
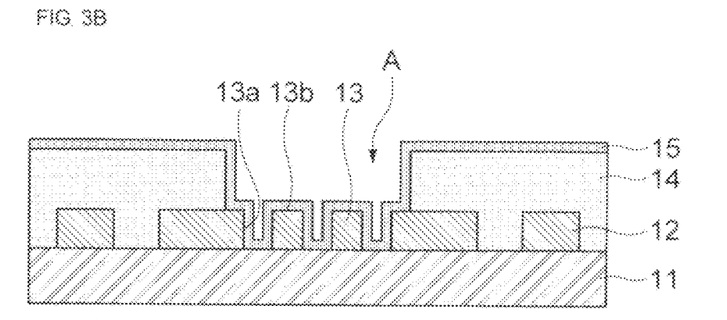

FIGS. 3a and 3b show the shape of concavo-convex patterns 13a and 13b formed by etching all of the thickness of the via pad 13, and a second insulating layer 14 stacked between the concavo-convex patterns 13a and 13b is all etched.

Figure 4A:
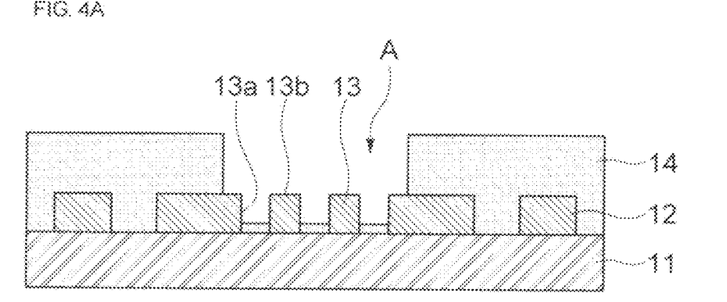
FIGS. 4a and 4b are views showing the shape of concavo-convex patterns in accordance with a second embodiment of the present invention.
Figure 4B:
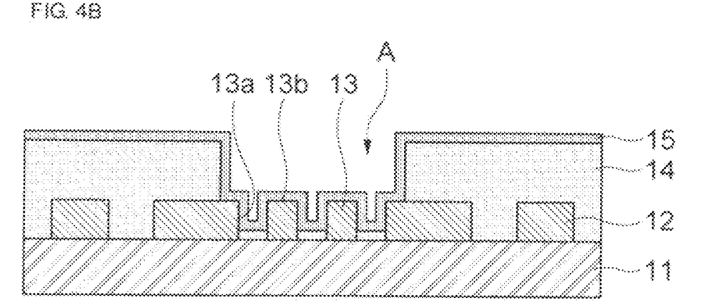

FIGS. 4a and 4b show the shape of concavo-convex patterns 13a and 13b formed by etching some of the thickness of the via pad 13, and a second insulating layer 14 stacked between the concavo-convex patterns 13a and 13b partially remains.

Figure 5A:
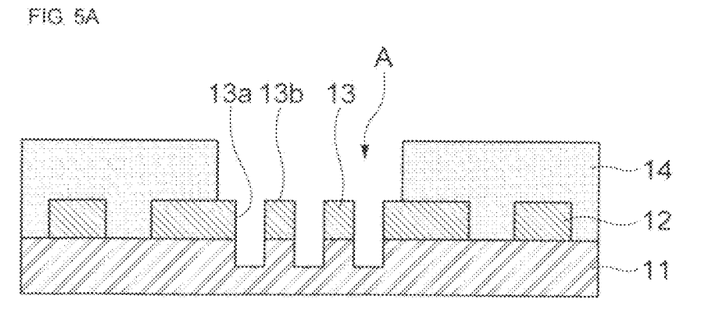
FIGS. 5a and 5b are views showing the shape of concavo-convex patterns formed on a via pad in accordance with a third embodiment of the present invention.
Figure 5B:
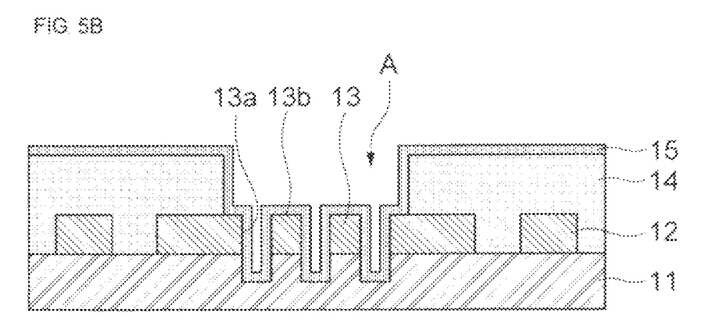
Figure 6A:
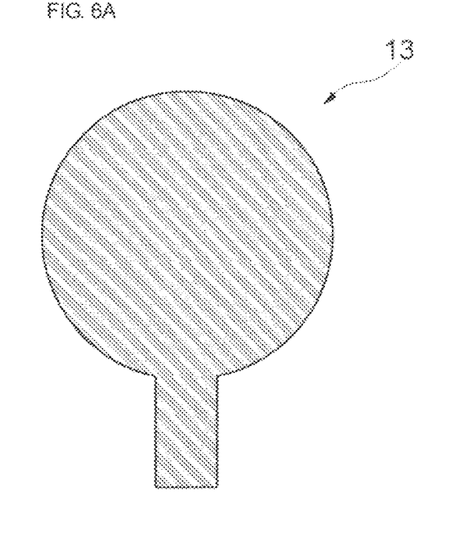
FIGS. 6a to 6f are views showing the shape of concavo-convex patterns formed on a via pad in accordance with an embodiment of the present invention.
Figure 6B:
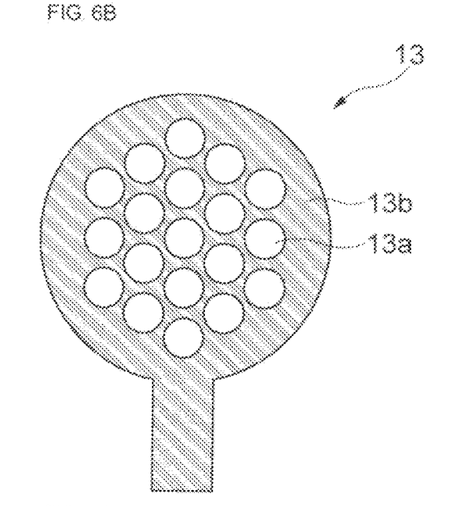
Figure 6C:
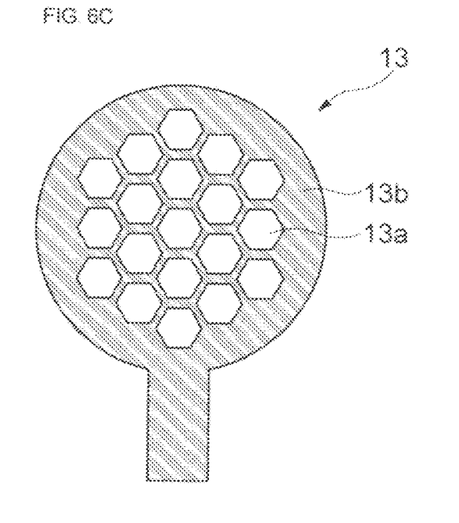
Figure 6D:
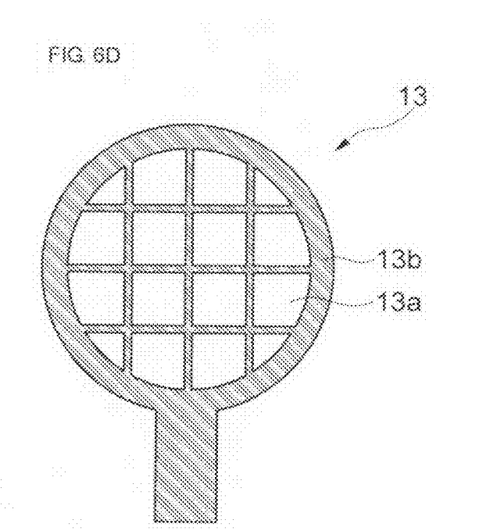
Figure 6E:
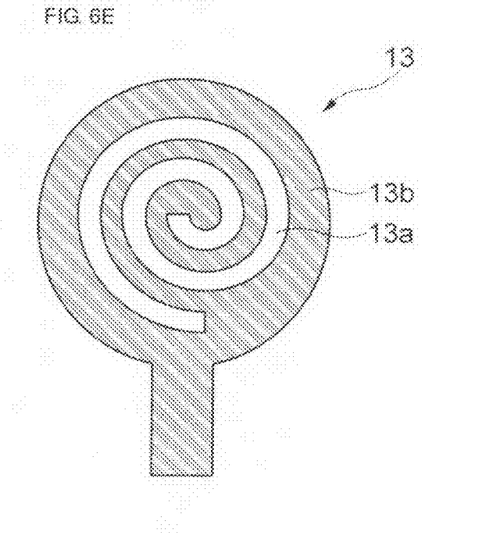
Figure 6F:
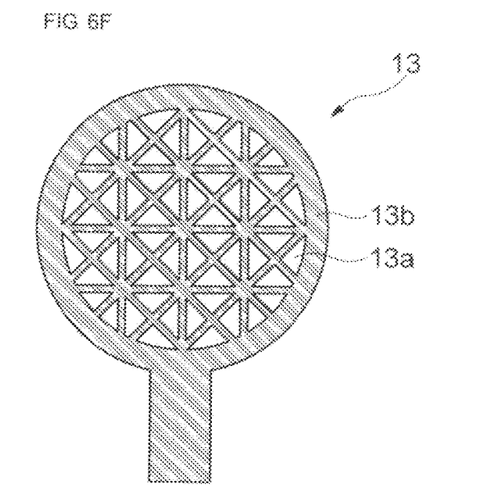

FIGS. 5a and 5b show the shape of concavo-convex patterns 13a and 13b formed by etching all of the via pad 13 and portions of a first insulating layer 11 formed on a lower surface of the via pad 13.

The concavo-convex patterns 13a and 13b shown in the above FIGS. 3a to 5b may be differently formed by adjusting the amount of laser irradiation or formed in different shapes by other methods.

The second insulating layer 14 is formed on the via pad 13 where the via hole A is not formed and on the circuit pattern 12, and the copper foil layer 15 is formed on the second insulating layer 14 and the via hole A to be electrically connected to an upper circuit pattern.

Second Embodiment

Figure 2:
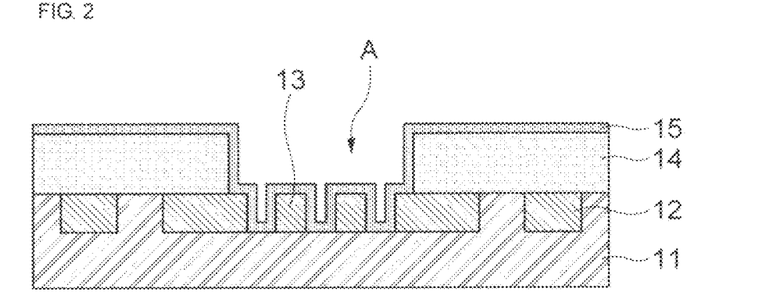
FIG. 2 is a view showing a cross section of a printed circuit board in accordance with a second embodiment of the present invention.

FIG. 2 is a view showing a cross section of a printed circuit board in accordance with a second embodiment of the present invention.

As shown in FIG. 2, a printed circuit board including a via pad with concavo-convex patterns in accordance with a second embodiment of the present invention includes a first insulating layer 11, a circuit pattern 12, a via pad 13 having concavo-convex patterns 13a and 13b formed thereon, a second insulating layer 14, and a copper foil layer 15.

When compared with a printed circuit board in accordance with a first embodiment, the printed circuit board in accordance with a second embodiment has differences in a region where the circuit pattern 12 is formed and a region where the via pad 13 having the concavo-convex patterns 13a and 13b formed thereon is formed.

The first insulating layer 11 is made of polyimide, and portions of one or both surfaces thereof are etched, and the circuit pattern 12 and the via pad 13 are formed in the etched portions of the first insulating layer 11.

The via pad 13 is disposed by being spaced apart from the circuit pattern 12 and formed on a lower surface where a via hole A is formed. A cross section of the via pad 13 is larger than a lower cross section of the via hole A formed on an upper surface thereof, and the concavo-convex patterns 13a and 13b are formed on the via pad 13.

That is, while a circuit pattern 12 and a via pad 13 of the printed circuit board in accordance with a first embodiment are formed on the first insulating layer 11, the circuit pattern 12 and the via pad 13 of the printed circuit board in accordance with a second embodiment are formed in the etched portions of the first insulating layer 11.

Therefore, the circuit pattern 12 and the via pad 13 of the printed circuit board in accordance with a second embodiment are formed by forming the first insulating layer 11, forming trenches in portions of the first insulating layer 11, and plating inside the trenches.

Since a cross section of a via pad of a conventional printed circuit board is different from a cross section of a circuit pattern, it causes a deposition rate difference in a plating process, and due to this, there is a problem that the via pad is non-uniformly plated.

However, since the via pad 13 of the printed circuit board of the present invention includes the concavo-convex patterns 13a and 13b to minimize a cross section difference with the circuit pattern 12, it is possible to uniformly form a plating layer.

Further, since the plating layer is formed between the concavo-convex patterns 13a and 13b, it is possible to improve via connection strength.

Method of Manufacturing Printed Circuit Board Including Via Pad with Concavo-Convex Patterns

First Embodiment

FIGS. 7a to 7e are views showing a method of manufacturing a printed circuit board in accordance with a first embodiment of the present invention.

Figure 7A:
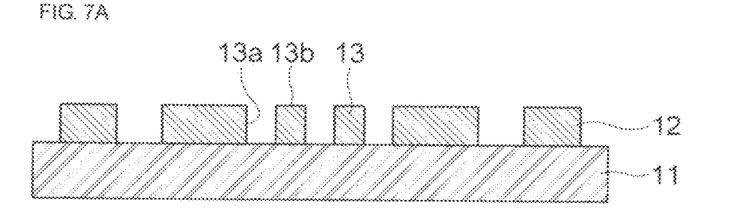
FIGS. 7a to 7e are views showing a method of manufacturing a printed circuit board in accordance with a first embodiment of the present invention.
Figure 7B:
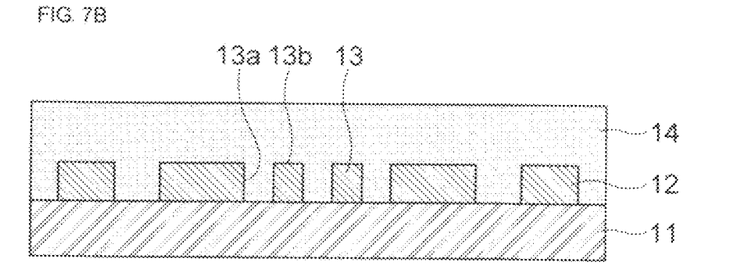

As shown in FIGS. 7a to 7e, a method of manufacturing a printed circuit board including a via pad with concavo-convex patterns in accordance with a first embodiment of the present invention forms a circuit pattern 12 and a via pad 13 with concavo-convex patterns 13a and 13b on a first insulating layer 11 (referring to FIG. 7a).

Here, the concavo-convex patterns 13a and 13b are formed by etching portions of the via pad 13 through laser irradiation or performing selective plating after forming a mask.

The concavo-convex patterns 13a and 13b are formed in one of a circular shape, a hexagonal shape, a square shape, a spiral shape, and a shape formed by crossing a plurality of diagonal lines and formed regularly.

Further, the concavo-convex patterns 13a and 13b are formed by etching some or all of the thickness of the via pad 13 or by etching the via pad 13 and portions of the first insulating layer 11 (referring to FIGS. 3a to 5b).

Figure 7C:
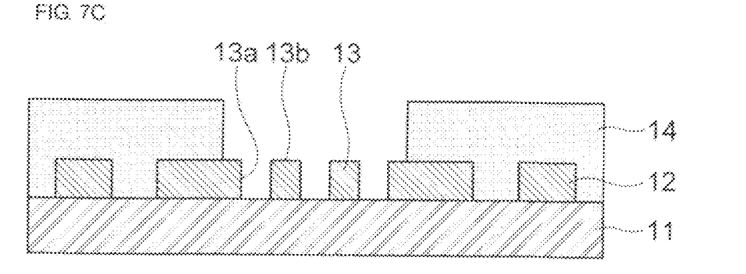
Figure 7D:
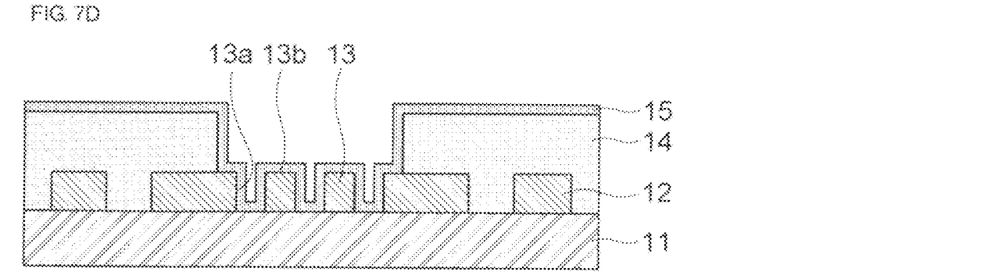

Next, a second insulating layer 14 is formed on the circuit pattern 12 and the via pad 13 having the concavo-convex patterns 13a and 13b formed thereon (referring to FIG. 7b), and a via hole A is formed by etching a portion of the second insulating layer 14 (referring to FIG. 7c).

Figure 7E:
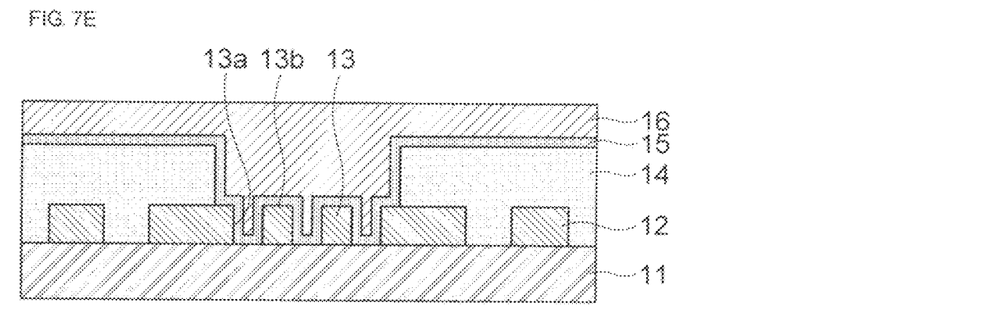

After a copper foil layer 15 is formed on the insulating layer 14 having the via hole A formed therein (referring to FIG. 7d), copper plating 16 is performed on the copper foil layer 15 (referring to FIG. 7e).

Second Embodiment

FIGS. 8a to 8e are views showing a method of manufacturing a printed circuit board in accordance with a second embodiment of the present invention.

Figure 8A:
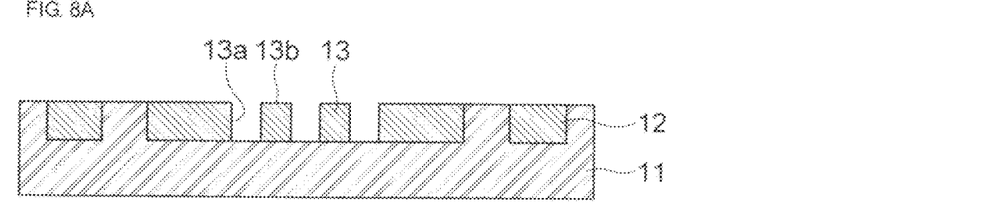
FIGS. 8a to 8e are views showing a method of manufacturing a printed circuit board in accordance with a second embodiment of the present invention.
Figure 8B:
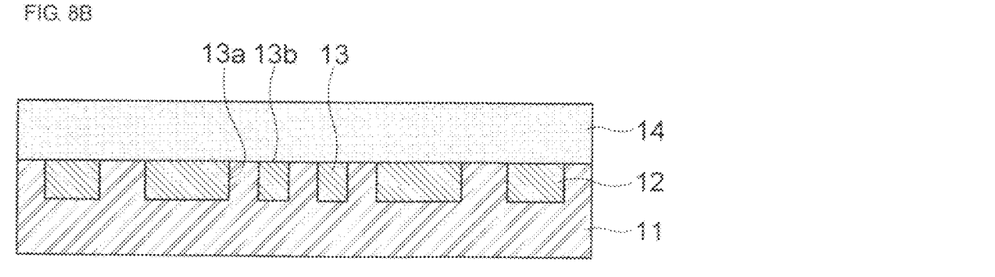

As shown in FIGS. 8a to 8e, a method of manufacturing a printed circuit board including a via pad with concavo-convex patterns in accordance with a second embodiment of the present invention forms a circuit pattern 12 by etching a portion of a first insulating layer 11 and forms a via pad 13 with concavo-convex patterns 13a and 13b in the etched portion of the first insulating layer 11, which is spaced apart from the circuit pattern 12 (referring to FIG. 8a).

Here, the concavo-convex patterns 13 and 13b are formed by etching portions of the via pad 13 through laser irradiation or performing selective plating after forming a mask.

The description of the shape and features of the concavo-convex patterns 13a and 13b is the same as that of a method of manufacturing a printed circuit board in accordance with a first embodiment.

Figure 8C:
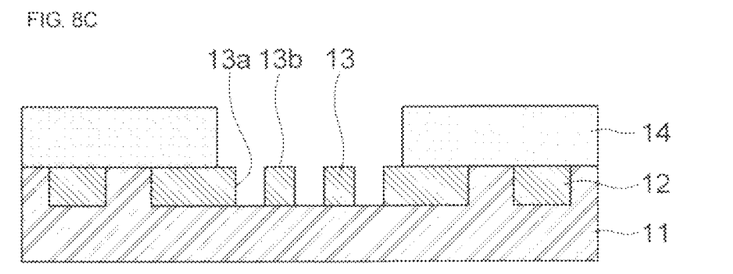
Figure 8D:
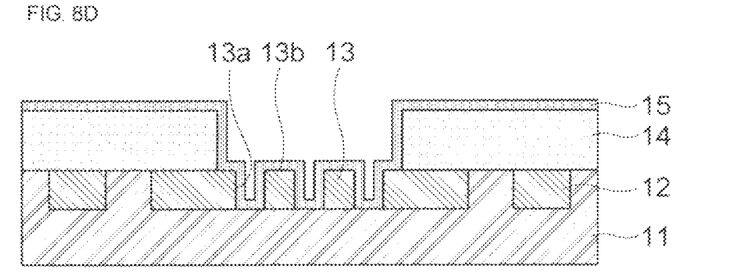

Next, a second insulating layer 14 is formed on the circuit pattern 12 and the via pad 13 having the concavo-convex patterns 13a and 13b formed thereon (referring to FIG. 8b), and a via hole A is formed by etching a portion of the second insulating layer 14 (referring to FIG. 8c).

Figure 8E:
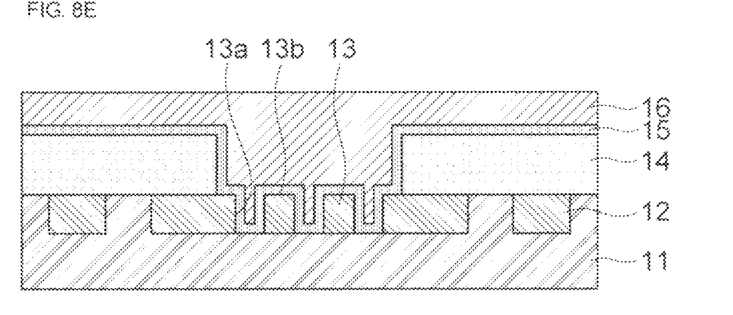

After a copper foil layer 15 is formed on the second insulating layer 14 having the via hole A formed therein (referring to FIG. 8d), copper plating 16 is performed on the copper foil layer 15 (referring to FIG. 8e).

When compared to the method of manufacturing the printed circuit board in accordance with a first embodiment, the method of manufacturing the printed circuit board in accordance with a second embodiment has a difference in that the circuit pattern 12 and the via pad 13 are disposed in the etched portions of the first insulating layer 11.

In embodiments of the present invention, since the total plating area is increased as much as the concavo-convex patterns formed on the via pad and it is possible to form a three-dimensional connection surface, there is an effect of improving via connection reliability and strength.

Further, by forming the concavo-convex patterns on the via pad, it is possible to maintain a similar deposition rate in a plating process by minimizing an area difference between the via pad and the peripheral circuit pattern and to uniformly form the plating thickness of the via pad and the circuit pattern.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A printed circuit board comprising:
a circuit pattern formed in a recessed portion of a first insulating layer;
a via pad formed in a recessed portion of the first insulating layer, disposed by being spaced apart from the circuit pattern, formed on a lower surface, where a via hole is formed, to have a cross section larger than that of the via hole, and having concavo-convex patterns recessed in the first insulating layer;
a second insulating layer formed on the via pad where the via hole is not formed and on the circuit pattern; and
a copper foil layer formed on the surfaces of the second insulating layer, surfaces of the via pad, and exposed surfaces of the first insulating layer in the concavo-convex patterns.

2. The printed circuit board according to claim 1, wherein the concavo-convex patterns are formed in at least one shape selected from a circular shape, a hexagonal shape, a square shape, a spiral shape, and a shape formed by crossing a plurality of diagonal lines.

3. The printed circuit board according to claim 1, wherein the first insulating layer is made of polyimide.

4. The printed circuit board according to claim 1, wherein the circuit pattern or the via pad is formed of a copper foil layer.

* * * * *